United States Patent
De Raad et al.

(10) Patent No.: US 10,262,988 B2
(45) Date of Patent: Apr. 16, 2019

(54) ELECTROSTATIC DISCHARGE PROTECTION DEVICE

(71) Applicant: Nexperia B.V., Nijmegen (NL)

(72) Inventors: Gijs Jan De Raad, Bemmel (NL);
Suzana Domingues, Eindhoven (NL);
Harrie Martinus Maria Horstink,
Warnsveld (NL)

(73) Assignee: Nexperia B.V., Nijmegen (NL)

( * ) Notice: Subject to any disclaimer, the term of this patent is extended or adjusted under 35 U.S.C. 154(b) by 0 days.

(21) Appl. No.: 15/284,576

(22) Filed: Oct. 4, 2016

(65) Prior Publication Data

US 2017/0117267 A1 Apr. 27, 2017

(30) Foreign Application Priority Data

Oct. 27, 2015 (EP) .................................... 15191760

(51) Int. Cl.
*H02H 9/04* (2006.01)
*H01L 27/02* (2006.01)
(Continued)

(52) U.S. Cl.
CPC ...... *H01L 27/0266* (2013.01); *H01L 27/0277* (2013.01); *H01L 29/0692* (2013.01);
(Continued)

(58) Field of Classification Search
CPC ............. H01L 27/0248; H01L 27/0255; H01L 27/0266; H01L 29/0649; H01L 29/41725; H01L 29/41758; H01L 29/8613
USPC .................... 257/355, 491; 361/56
See application file for complete search history.

(56) References Cited

U.S. PATENT DOCUMENTS 5,355,008 A * 10/1994 Moyer ................ H01L 23/4824
257/341
5,831,316 A 11/1998 Yu et al.
(Continued)

OTHER PUBLICATIONS

De Raad, Gijs, "The Influence of Source Ballast Resistance on Current Spreading in Grounded Gate Nmosts", IEEE Explore, Oct. 18, 2012, 10 pages.
(Continued)

*Primary Examiner* — Edward Chin
(74) *Attorney, Agent, or Firm* — Ohlandt, Greeley, Ruggiero & Perle, L.L.P.

(57) ABSTRACT

An electrostatic discharge protection device and a method of making the same. The device includes a device area located on a semiconductor substrate. The device also includes an array of coextensive, laterally spaced fingers located within the device area. Each finger includes an elongate source and an elongate drain separated by an elongate gate. The fingers are electrically connected in parallel for conducting an electrostatic discharge current during an electrostatic discharge event. The device further includes a plurality of body contact regions. A layout of the body contact regions is graded such that a greater number of the body contact regions, larger body contact regions, or both are located towards a periphery of the device area than towards a central part of the device area. The layout of the body contact regions may encourage triggering of the electrostatic discharge protection device within the central part of the device area.

11 Claims, 3 Drawing Sheets

(51) Int. Cl.
*H01L 29/06* (2006.01)
*H01L 29/10* (2006.01)
*H01L 29/78* (2006.01)

(52) U.S. Cl.
CPC ...... *H01L 29/1095* (2013.01); *H01L 29/7831* (2013.01); *H01L 29/7835* (2013.01); *H02H 9/046* (2013.01)

(56) References Cited

U.S. PATENT DOCUMENTS

| | | | | |
|---|---|---|---|---|
| 6,320,231 | B1* | 11/2001 | Ikehashi | H01L 23/62 257/173 |
| 6,952,037 | B2* | 10/2005 | Ishikawa | H01L 27/0255 257/355 |
| 8,232,600 | B2* | 7/2012 | Arai | H01L 21/823481 257/355 |
| 2002/0033507 | A1* | 3/2002 | Maria Verhaege | H01L 27/0266 257/360 |
| 2002/0149059 | A1 | 10/2002 | Ker et al. | |
| 2003/0081070 | A1* | 5/2003 | Liu | B41J 2/14072 347/58 |
| 2003/0189230 | A1 | 10/2003 | Hung et al. | |
| 2005/0275032 | A1 | 12/2005 | Kodama et al. | |
| 2007/0090414 | A1 | 4/2007 | Sutou et al. | |
| 2010/0149705 | A1* | 6/2010 | Son | H01L 27/0266 361/56 |
| 2012/0007140 | A1 | 1/2012 | Vashchenko | |
| 2012/0326235 | A1 | 12/2012 | Otsuru et al. | |
| 2015/0228638 | A1* | 8/2015 | Smith | H01L 27/0248 257/491 |
| 2016/0276336 | A1* | 9/2016 | Lee | H01L 27/0266 |

OTHER PUBLICATIONS

De Raad et al., "Dynamic Aspects to Current Spreading in GGNmosts", IEEE—Electrical Overstress/Electrostatic Discharge Symposium (EOS/ESD), 2014, 11 pages.

Olthof et al., "Non-linear width scaling of ESD protection devices and link with p-well implant in BCD-processes", Microelectronics Reliability, 2008 Published by Elsevier Ltd, vol. 48, 3 pages.

* cited by examiner

ELECTROSTATIC DISCHARGE PROTECTION DEVICE

CROSS-REFERENCE TO RELATED APPLICATIONS

This application claims priority under 35 U.S.C. § 119 of European Patent application no. 15191760.6, filed on Oct. 27, 2015, the contents of which are incorporated by reference herein.

BACKGROUND

The present specification relates to an electrostatic discharge (ESD) protection device comprising and to a method of making an electrostatic discharge protection device.

The Grounded Gate n-type Metal Oxide Semiconductor Transistor (hereinafter "GGNmost") is often used as a primary protection element in pad-based ESD-schemes. In some designs the GGNmost is divided into several smaller GGNmosts, which are often referred to as fingers. The individual GGNmosts are connected in parallel.

The fingers in such an ESD protection device can sometimes share a single ring-shaped body contact. Alternatively, each finger may have its own body contact.

A design challenge in such devices is to ensure that all fingers in the GGNmost trigger during an ESD event, so as to ensure that the GGNmost can effectively sink the ESD current without sustaining internal damage. In devices where all fingers share one ring-shaped body contact, one finger may conduct all of the ESD current until a critical current density is reached, at which point a next finger of the device triggers, and so on. In a well-designed GGNmost, this process can take place at a current density that is low compared to the current density at which the GGNmost would fail, so that effective triggering of all fingers may be ensured.

In devices where each finger has its own body contact, triggering of all the fingers of the device may be ensured by increasing the drain ballast resistance to the point that before each finger reaches its fail current density, its voltage drop has already increased beyond the trigger voltage of the other fingers in the device. Accordingly, before each finger fails, another finger of the device will trigger to accommodate the ESD current. A drawback of this particular design is that the device may have a comparatively high voltage drop during an ESD event, which may present a more severe ESD stress to the circuit that the GGNmost is intended to protect.

SUMMARY

Aspects of the present disclosure are set out in the accompanying independent and dependent claims. Combinations of features from the dependent claims may be combined with features of the independent claims as appropriate and not merely as explicitly set out in the claims.

According to an aspect of the present disclosure, there is provided an electrostatic discharge protection device comprising:
  a semiconductor substrate;
  a device area located on the substrate;
  an array of coextensive, laterally spaced fingers located within the device area, each finger comprising an elongate source and an elongate drain separated by an elongate gate, wherein the fingers are electrically connected in parallel for conducting an electrostatic discharge current during an electrostatic discharge event; and
  a plurality of body contact regions,
wherein a layout of the body contact regions is graded such that a greater number of said body contact regions and/or larger body contact regions are located towards a periphery of the device area than towards a central part of the device area, for encouraging triggering of the electrostatic discharge protection device within the central part of the device area.

According to another aspect of the present disclosure, there is provided a method of making an electrostatic discharge protection device, the method comprising:
  providing a semiconductor substrate;
  defining a device area located on the substrate;
  forming an array of coextensive, laterally spaced fingers within the device area, each finger comprising an elongate source and an elongate drain separated by an elongate gate, wherein the fingers are electrically connected in parallel for conducting an electrostatic discharge current during an electrostatic discharge event; and
  forming a plurality of body contact regions on the substrate,
wherein a layout of the body contact regions is graded such that a greater number of said body contact regions and/or larger body contact regions are located towards a periphery of the device area than towards a central part of the device area, for encouraging triggering of the electrostatic discharge protection device within the central part of the device area.

In an electrostatic discharge protection device that includes a plurality of fingers, triggering tends to take place in regions that are located furthest away from the body contacts, where it may tend to be easier to lift the potential of the body of the substrate.

However, triggering may also take place elsewhere within the device. For instance, triggering may occur at the end of one of the fingers, where the electric field at the drain/body/gate may be highest. Triggering at the end of one of the fingers can lead to a higher than usual current density (and hence temperature) within the device, reducing its robustness.

By providing an electrostatic discharge protection device having plurality of body contact regions having a graded layout, in which a greater number of body contact regions and/or larger body contact regions are located towards a periphery of the device area than towards a central part of the device area, triggering of the device within a central part of a device area of the device may be encouraged. This may mitigate the tendency of the device to trigger in other locations, such as at the ends of the fingers. This may increase the robustness of the device.

The graded layout of the body contact regions may be implemented in a number of ways, providing considerable design flexibility.

At least some of the body contact regions may each include a doped island located at a surface of the substrate and one or more individual electrical contacts located on the island. A greater number of the doped islands may be located towards the periphery of the device area than towards the central part of the device area. In some examples, larger doped islands may be located towards the periphery of the device area than towards the central part of the device area. These approaches may be combined.

Body contact regions of the device that include larger doped islands may be provided with more individual electrical contacts than body contact regions of the device including smaller doped islands.

In some examples, no body contact regions may be located within the central part of the device area. In this way, triggering of the device within the central part of the device area may be strongly encouraged.

The body contact regions may be arranged in rows that coextend with the fingers within the device area. Each finger may be provided with a row of body contacts. At least some of the rows of body contact regions may be each located adjacent the elongate source of a finger of the device. Some of the rows may be shared by adjacent fingers of the device.

Each row of body contact regions may have a middle and two ends. At least some of the rows of body contact regions may include fewer and/or smaller body contact regions located at their middle than at their two ends. The middles of rows of body contact regions located towards the central part of the device area may include fewer and/or smaller body contact regions than the middles of rows of body contact regions located towards the periphery of the device area.

Rows of body contact regions located towards the central part of the device area may include fewer and/or smaller body contact regions than rows of body contact regions located towards the periphery of the device area.

The device area may, for instance, be rectangular (e.g. the device area may be oblong or square).

The electrostatic discharge protection device may for instance be a grounded gate NMOS transistor or an extended drain NMOS transistor. It is also envisaged that the device may be a grounded gate PMOS transistor or an extended drain PMOS transistor According to a further aspect of the present disclosure, there is provided an electrostatic discharge protection circuit including an electrostatic discharge protection device of the kind described above.

According to another aspect of the present disclosure, there is provided an integrated circuit including an electrostatic discharge protection device of the kind described above.

BRIEF DESCRIPTION OF THE DRAWINGS

Embodiments of this disclosure will be described hereinafter, by way of example only, with reference to the accompanying drawings in which like reference signs relate to like elements and in which.

DETAILED DESCRIPTION

Embodiments of this disclosure are described in the following with reference to the accompanying drawings.

Figure 1:
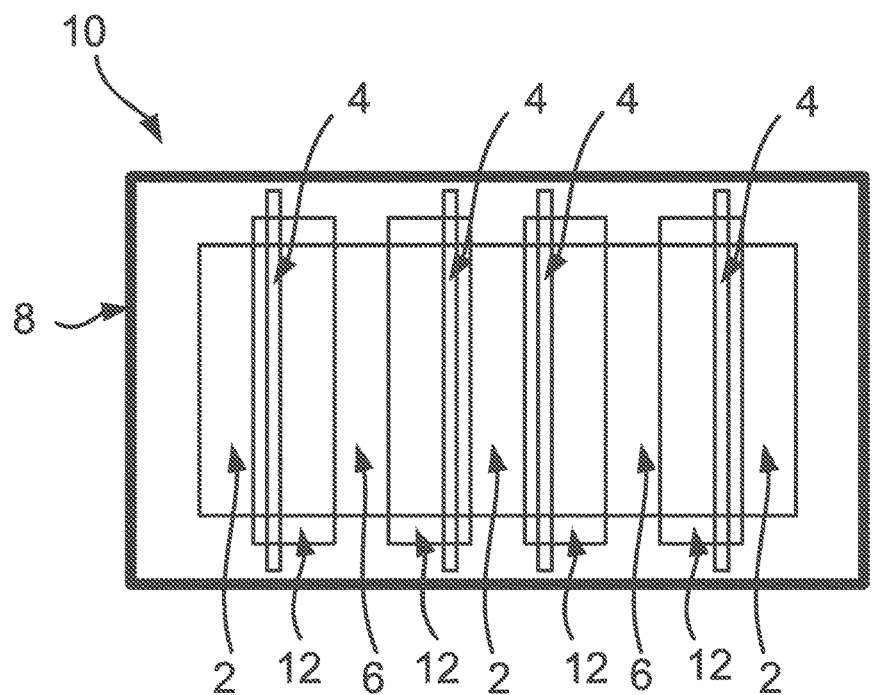
FIG. 1 shows an example of a field effect transistor.

FIG. 1 shows an example of an electrostatic discharge (ESD) protection device 10 comprising a grounded gate n-channel metal oxide semiconductor transistor (ggNMOST).

The ggNMOST is provided on a semiconductor substrate, e.g. a silicon substrate. The device 10 includes an array of coextensive, laterally spaced fingers located within a device area on the substrate. Each finger includes a source 2 and a drain 6. A gate 4 separates the source 2 from the drain 6. Each of the source 2, the gate 4, and the drain 6 is elongate. The fingers of the device 10 may be electrically connected in parallel. The gate 4 may include polysilicon. In some examples, a silicide block 12 (also known in the art as a silicon protection or SiProt layer) may also be provided in each finger of the device 10, which may function as a mask, locally to prevent silicidation taking place during manufacture.

The device 10 also includes a body contact, which is shared by the fingers of the device 10. These body contact is provided in the shape of a ring, extending around a periphery of the device area, as shown by the solid line indicated in FIG. 1 with reference numeral 8.

Figure 2:
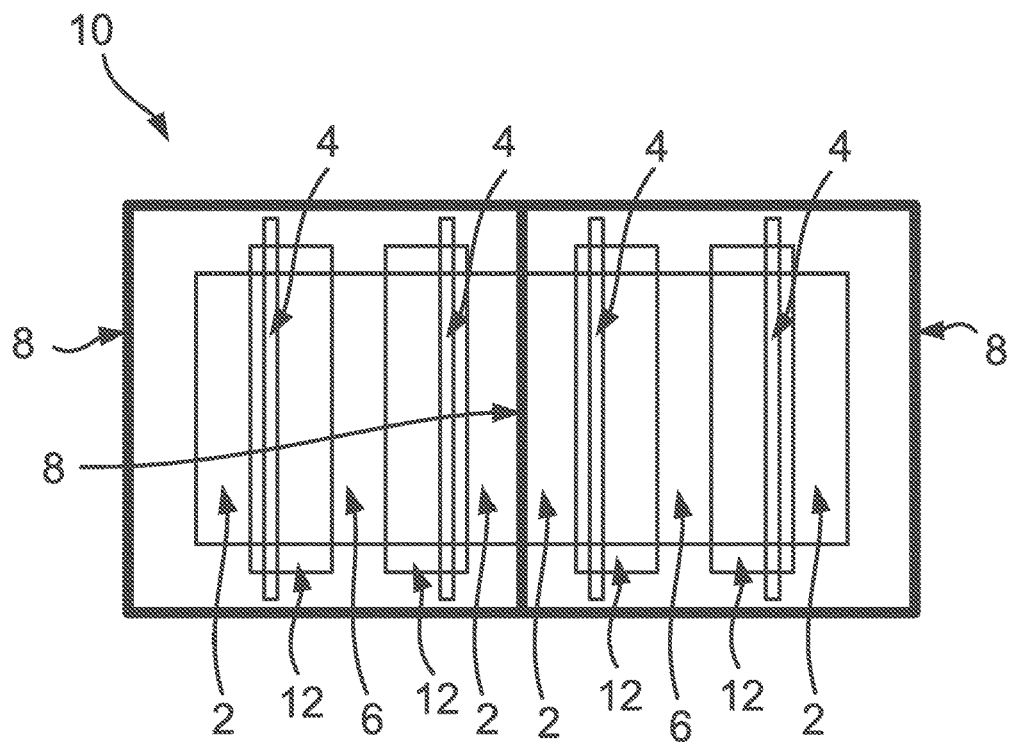
FIG. 2 shows another example of a field effect transistor.

FIG. 2 shows another example of an electrostatic discharge protection device 10 comprising a grounded gate n-channel metal oxide semiconductor transistor (ggNMOST). The device in FIG. 2 is similar to that shown in FIG. 1, except that the arrangement of the body contact is different. In the example of FIG. 2, each finger of the device 10 is provided with its own body contact, which is located near to each source 2. Again in FIG. 2, the locations of the body contacts are indicated by the solid line 8. Note that in FIG. 2, the source 2 of some of the fingers of the device 10 share common body contact 8.

The ggNMOST of FIGS. 1 and 2 are so-called "folded ggNMOST" devices, in which the device is divided into several smaller ggNMOSTs, which are connected in parallel connected in parallel for conducting an electrostatic discharge current during an electrostatic discharge event.

A design challenge in devices incorporating folded ggNMOSTs is to enable as many of the fingers of the device as possible to trigger during an ESD event, so that the GGNmost may sink the amount of ESD current it was designed to sink, without sustaining internal damage.

In a device of the kind shown in FIG. 1, during an ESD event, a first finger tends to conduct all of the ESD current, until some critical current density is reached, at which point a next finger of the device triggers, and so on. In order to ensure that all of the fingers in the device 10 may trigger during an ESD event, the device 10 may be designed such that the triggering of each "next" finger takes place at a current density that is lower than the current density at which the ggNMOST would fail.

In a device of the kind shown in FIG. 2, in which each finger has its own body contacts, triggering of all fingers may be ensured by increasing the drain ballast resistance to the point that when one finger reaches its fail current density, its voltage drop has increased beyond the trigger voltage of the other fingers in the device 10.

In an electrostatic discharge protection device that includes a plurality of fingers, triggering tends to take place in regions that are located furthest away from the body contact(s), where it may tend to be easier to lift the potential of the body of the substrate.

For instance, in the device of FIG. 1, triggering may usually occur towards a central part of the device area occupied by the ggNMOST. However, triggering may also take place elsewhere in the device 10, such as near an end of one of the fingers, where the polysilicon of the gate 6 crosses the active-edge, where the electric field near the drain/body/gate assembly may be highest there. When a folded ggNMOST triggers near to one of the ends of its fingers, the current density immediately after triggering may be higher than otherwise would have been the case, which may increase internal dissipation and which may ultimately leads to a higher device temperature. In extreme cases this can lead to failure of the GGNmost at a current well below the one it is intended to protect against.

In devices of the kind shown in FIG. 2, the location of triggering may be more random, which may exacerbate the problem described above.

Figure 3:
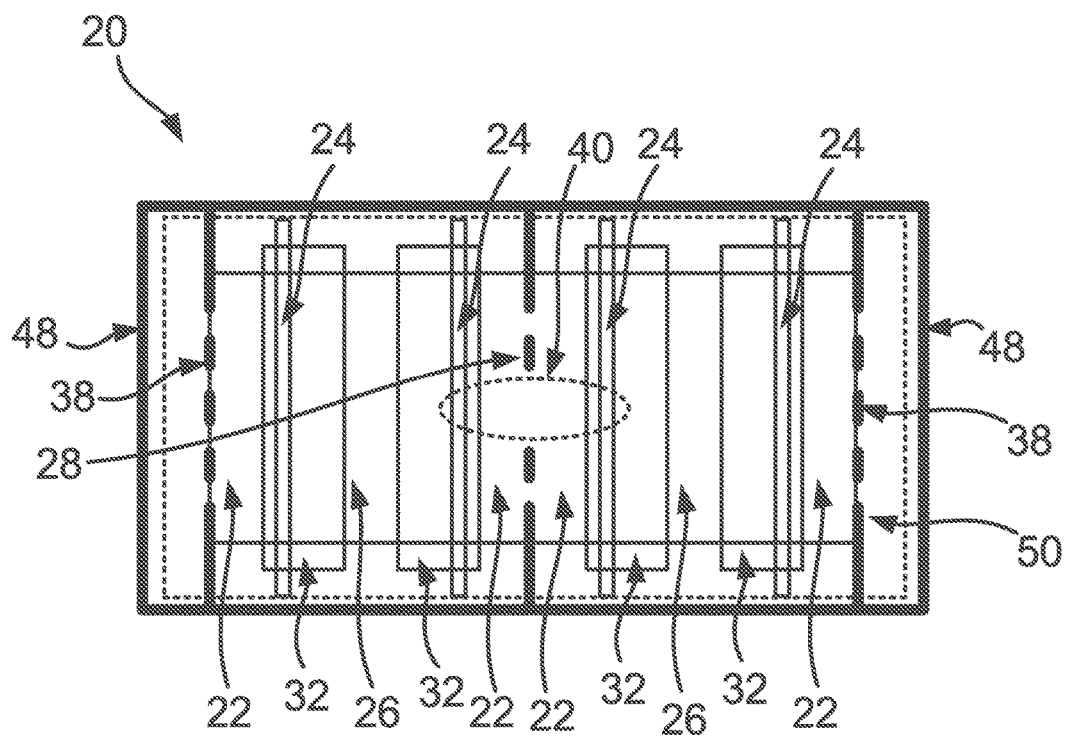
FIGS. 3 and 4 each show an example of an electrostatic discharge protection device according to an embodiment of this disclosure.

FIG. 3 shows an example of an electrostatic discharge (ESD) protection device 20 according to an embodiment of this disclosure. In this example, the device comprises a grounded gate n-channel metal oxide semiconductor transistor (ggNMOST). However, it is also envisaged that the device 20 may comprise another kind of transistor, such as an extended drain NMOS transistor. It is also envisaged that the device 20 may comprise a p-channel transistor (e.g. ggPMOST or extended drain PMOS transistor).

The device 20 includes a semiconductor substrate, e.g. a silicon substrate. The substrate may a major surface, upon which a device area of the device may be located.

The device 20 includes an array of coextensive, laterally spaced fingers located within the device area on the substrate. In the example of FIG. 3, the device 20 includes four fingers, although it is envisaged that a greater number of fingers may be provided. Each finger of the device 20 includes a source 22 and a drain 26. A gate 24 separates the source 22 of each finger from the drain 26 of each finger. The gate 24 may include polysilicon. Each of the source 22, the gate 24, and the drain 26 is elongate. The length of the fingers may be chosen to suit design requirements. Note that at least some of the fingers of the device 20 may share a common source 22 or drain 26. For instance, the two fingers of the device 20 shown on the left hand side of the device 20 in FIG. 3 share a common drain 26, as do the two fingers of the device 20 shown on the right hand side of the device 20 in FIG. 3, while the two finger located toward the centre of the device 20 shown in FIG. 3 share a common source 22.

In this example, the fingers of the device 20 form a folded ggNMOST, where each finger forms an individual ggNMOST, and in which the individual ggNMOSTs formed by the fingers are connected in parallel connected in parallel for conducting an electrostatic discharge current during an electrostatic discharge event. For instance, each source 22 of the device 20 may be connected together, as may be each drain 26 of the device 20. The gates 24 of the device 20 may also be connected together, e.g. to connect to a common ground connection.

The device area may be defined as an area located on the surface (e.g. major surface) of the substrate that incorporates the fingers of the device 20. In the example of FIG. 3, the device area is indicated using reference numeral 50. Typically, the device area would not include features of other devices, which may also be located in the surface of the substrate. The device area 50 may be rectangular. For instance, in the example of FIG. 3, the device area 50 is oblong. The fingers of the device 20 may extend substantially parallel to an edge of the device area 50. For instance, in the example of FIG. 3, the fingers (and thus the elongate source 22, gate 24 and drain 26 of each finger) extend substantially parallel to the shorter edges of the oblong shaped device area 50. It is also envisaged that the fingers (and thus the elongate source 22, gate 24 and drain 26 of each finger) may extend substantially parallel to the longer edges of an oblong shaped device area 50. In this example, some of the edges of the device area are coincident with the ends of the fingers of the device 20. The device area in this example includes a central part, which is indicated generally in FIG. 3 by the dotted area labelled 40.

Each finger of the device 20 may also include a silicide block 32 (also known in the art as a silicon protection or SiProt layer) may also be provided in each finger of the device 10, which may function as a mask, locally to prevent silicidation taking place in selected areas of the device during manufacture.

The device 20 also includes a plurality of body contact regions. In accordance with embodiments of this disclosure, a layout of the body contact regions is defined so as to encourage triggering of the electrostatic discharge protection device within the central part 40 of the device area 50. In particular, the layout of the body contact regions may be graded such that a greater number of body contact regions and/or larger body contact regions are located towards a periphery of the device area 50 than towards the central part 40 of the device area 50.

In the example of FIG. 3, the layout and grading of the body contact regions is indicated schematically by the reference numerals 28, 38, 48. As will be described in more detail below in relation to FIG. 5, at least some of the body contact regions may comprise doped islands located at a surface of the substrate, with one or more individual electrical contacts located on each island. The grading of the layout of the body contact regions may be adjusted by choosing the location and size of these islands, as well as the number of individual electrical contacts located on each island. It is also envisaged that some of the body contact regions may comprise an unbroken strip contact. In particular, strip contacts of this kind may be used in locations near the periphery of the device area 50, to implement a body contact region having a relatively large size. For instance, the ring 48 described below may be implemented using a strip contact of this kind.

In the example of FIG. 3, the body contact regions in this example may include a ring 48 that may extend around a periphery of the device area 50. The body contact regions in this example may also be provided in one or more rows 28, 38. The rows 28, 38 may coextend with the fingers of the device 20 (accordingly, the rows 23, 38 may extend substantially parallel to an edge of the device area—in FIG. 3 the rows extend substantially parallel to the shorter edges of the oblong device area). In FIG. 3, row 28 is located toward the central part 40 of the device region 50, while rows 38 are located toward the periphery of the device area 50. Note that each row 28, 38 may be located adjacent the elongate source of one of the fingers of the device 20. As shown in FIG. 3, some of the rows may be shared by adjacent fingers. For instance, the row 28 in FIG. 3 is shared be the sources 22 of the two fingers located towards the central part 40 of the device.

As noted above, the layout of the body contact regions in this example is graded such that a greater number of body contact regions and/or larger body contact regions are located towards a periphery of the device area 50 than towards the central part 40 of the device area 50. This is represented schematically in FIG. 3 by the solid line used to denote the ring 48 (which is located towards the periphery of the device area), and by the broken line denoting the row 28 of body contacts located towards the central part 40 of the device area 50. The rows 38 are also shown using broken lines in FIG. 3, although these rows tend to include a greater number of body contact regions and/or larger body contact regions than the row 28, since they are located closer to the periphery of the device area 50 than the row 28.

Each row 28, 38 of body contact regions may have a middle and two ends. The ends may be located towards the periphery of the device area 50. The middles of some of the rows of body contact regions (e.g. row 28 in FIG. 3) may extend across the central part 40 of the device area 50.

To implement the graded layout of the body contact regions, at least some of the rows of body contact regions may include fewer and/or smaller body contact regions at their middles than at their two ends (this is shown schematically by the broken lines in FIG. 3, in respect of the rows 28, 38). Also, rows of body contact regions located towards the central part 40 of the device area 50 may include fewer and/or smaller body contact regions than rows of body contact regions located towards the periphery of the device area 50 (again this is shown schematically by the broken lines in FIG. 3, in respect of the rows 28, 38; in this example, the row 28 may include may include fewer and/or smaller body contact regions than the rows 38).

As can be seen in FIG. 3, in this example, no body contact regions are located within the central part 40 of the device area 50. To implement this, rows of body contact regions that extend across the central part 40 of the device area 50 (such as the row 28) may include a middle that does not include any body contact regions.

Accordingly, regions of the device 20 located towards the central part 40 of the device 40 may generally include fewer and/or smaller body contact regions than regions of the device 20 located towards the periphery of the device area 50 and this may, for instance, be implemented by varying the positions of the rows of body contact regions, by varying the number of body contact regions in each row, and/or by varying the distribution of body contact regions within the rows so that fewer and/or smaller body contact regions (or indeed no body contact regions) are located towards the middles of the rows.

As previously noted, triggering of the device 20 tends to take place in regions of the device 20 that are located furthest away from the body contacts regions, where it may tend to be easier to lift the potential of the body of the substrate. As shown schematically in FIG. 4, the graded layout of the body contacts regions of the device 20 may exploit this phenomenon to encourage triggering of the device 20 within the central part 40 of the device area 50. In particular, triggering of the device within the central part 40 of the device area 50 may be made more likely because fewer and/or smaller body contact regions (or indeed no body contact regions) are located towards the or within the central part 40 of the device area 50.

Figure 4:
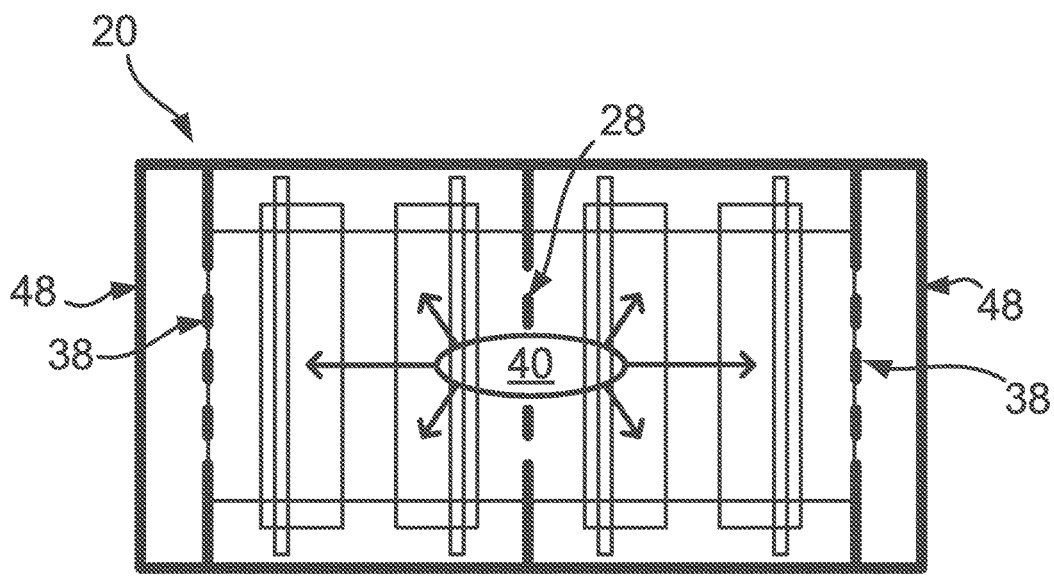

Because triggering of the device shown in FIGS. 3 and 4 may be more likely to trigger within the central part 40, triggering of the device 20 elsewhere, such as at an end of one of the fingers may be less likely. This may allow device failures associated with a higher than usual current density (and hence temperature) within the device to be reduced. Accordingly, ESD protection devices according to embodiments of this disclosure may be more robust.

FIG. 4 schematically illustrates that following initial triggering of the device 20 in the central part 40, the graded layout of the body contact regions may also encourage the active region of the device 20 to expand outwardly from the central part 40 of the device area 50, as the ESD current increases. Accordingly, in addition to encouraging initial triggering of the device 20 within the central part 40, the graded layout of the body contact regions may, as additional fingers of the device are triggered, encourage each "next" finger to trigger at a location towards the middle of that finger, away from the ends of the finger. Again, this may increase the robustness of the device 20, for the reasons noted above.

It is also envisaged that the effect of the graded layout of the body contact regions may overcome the effects of manufacturing process variations, which may otherwise lead to a tendency for the device to trigger in locations that may lead to high current densities, temperatures and consequently lead to device failure.

Figure 5:
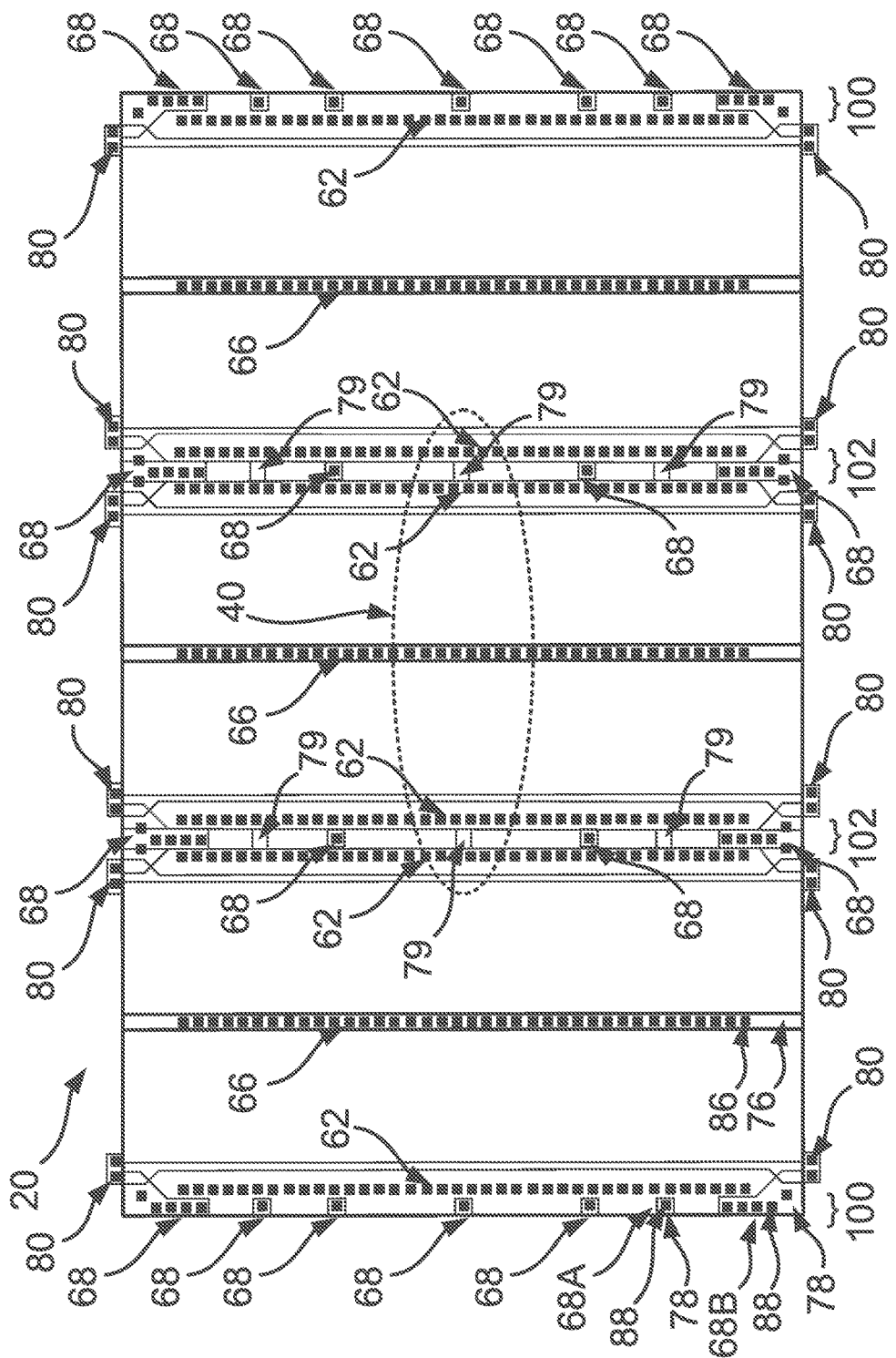
FIG. 5 shows an example an electrostatic discharge protection device according to another embodiment of this disclosure.

FIG. 5 shows another example of an electrostatic discharge (ESD) protection device 20 according to an embodiment of this disclosure. In particular, FIG. 5 shows the layout of a number of contact regions of the device 20.

As with the example described above in relation to FIGS. 3 and 4, the device 20 in this example comprises a grounded gate n-channel metal oxide semiconductor transistor (ggNMOST), although it is again envisaged that the device may instead comprise another kind of transistor, such as an extended drain NMOS transistor. It is also again envisaged that the device 20 may comprise a p-channel transistor (e.g. ggPMOST or extended drain PMOS transistor).

The device 20 includes a semiconductor substrate, e.g. a silicon substrate. The substrate may a major surface, upon which a device area of the device may be located.

The device 20 includes an array of coextensive, laterally spaced fingers located within the device area on the substrate, as already described above in relation to the example of FIGS. 3 and 4. In this example, the device 20 includes six fingers.

Again, in this example, the fingers of the device 20 form a folded ggNMOST, where each finger forms an individual ggNMOST, and in which the individual ggNMOSTs formed by the fingers are connected in parallel connected in parallel for conducting an electrostatic discharge current during an electrostatic discharge event.

In FIG. 5, the device 20 includes a plurality of source contacts 62. The source contacts 62 may be provided in a plurality of rows, for making contact with the sources of the fingers of the device 20 which, as noted above, may be elongate. The device 20 in this example also includes a plurality of drain contact regions 66. The drain contact regions 66 may be provided in a plurality of rows, for making contact with the drains of the fingers of the device 20 which, as noted above, may also be elongate. The drain contact regions 66 may include one or more $n^+$ doped strips 76 (or alternatively $p^+$ islands, where the device 20 is a p-channel device such as a ggPMOST) located at the surface of the substrate, with a plurality of individual electrical contacts 86 located on each island.

The device 20 of FIG. 5 also includes a plurality of gate contacts 80. In this example, the gate contacts 80 may be located at either end of the gates of the fingers of the device 20 (which, like the sources and drains, may also be elongate), toward the periphery of the device area.

The device 20 in this example further includes a plurality of body contact regions 68. As explained previously, the layout of the body contact regions 68 is graded, such that a greater number of the body contact regions 68 and/or larger body contact regions 68 are located towards a periphery of the device area than towards a central part of the device area.

In this example, the plurality of body contact regions 68 comprise doped islands 78 located at a surface of the substrate, with one or more individual electrical contacts 88 located on each island (e.g. the islands 78 and individual electrical contacts 88 of the body contact regions 68A and 68B are marked up in FIG. 5). In this example, the islands are $p^+$ doped (alternatively the islands may be $n^+$ doped, where the device 20 is a p-channel device such as a ggPMOST). It is also envisaged that the plurality of body contact regions may further include one or more strip contacts, such as a ring 48 of the kind described above in relation to FIGS. 3 and 4.

As will be described below, the use of body contact regions 68 that include doped islands 78 with one or more individual electrical contacts 88 may allow for a considerable degree of flexibility in grading their layout. Moreover, by using small, island-shaped body contacts, internal dissipation within the device 20 may be reduced, which may in turn increase the intrinsic fail current of the device 20. Furthermore, it is envisaged that, during the early stages of an ESD pulse, body contact regions of this kind may help to keep the transient current density low by ensuring that the expansion of the active region takes place quickly. This may suppress premature failure of the device 20.

In the example of FIG. 5, layout of the body contact regions 68 includes a greater number of doped islands 78 located towards the periphery of the device area than towards the central part 40 of the device area.

In a first example of this, it can be seen that there are more body contact regions 68 including doped islands 78 located in the rows of body contact regions 68 located at the far left hand side and far right hand side of the device area 68 shown in FIG. 5 (these rows are denoted in FIG. 5 by reference numeral 100) than in the two rows of body contact regions 68 that extend through the central part 40 (these rows are denoted in FIG. 5 by reference numeral 102). The reference numeral 79 is used in FIG. 5 to denote gaps in the rows 102, in which body contact regions corresponding to the positions of body contact regions 68 in the rows 100 are not provided.

In a second example of this, it can from FIG. 5 that no body contact regions are provided toward the middles of the rows 102, whereas an island 79 comprising a plurality of individual electrical contacts 88 is provided at both ends of each row 102. Note that in this example, as already described above in relation to FIGS. 3 and 4, there are no body contact regions 68 located in the central part 40 of the device area of the device 20.

In the example of FIG. 5, the layout of the body contact regions 68 includes larger doped islands 78 located towards the periphery of the device area than towards the central part 40 of the device area. As an example of this, it can be seen that the islands 78 located at the ends of each row 100, 102 of body contact regions 68 are larger than the islands 78 located towards the middle of each row 100, 102 (for instance, compare the size of the island 78 of the body contact region 68B with that of the island 78 of the body contact region 68A).

Larger doped islands 78 of the layout may include more individual electrical contacts 88 than smaller doped islands 78 of the layout. This may add a further degree of design flexibility for designing the graded layout of the body contact regions 68 of the device 20, since islands of similar or the same size may nevertheless be provided with a different number of individual electrical contacts 88.

As explained already above in relation to FIGS. 3 and 4, the graded layout of the body contact regions 68 shown in FIG. 5 may encourage triggering of the device 20 within the central part 40 of the device area and, after initial triggering, may also encourage the active region of the device 20 to expand outwardly from the central part 40 of the device area, as the ESD current increases.

It will be appreciated that the different example approaches described above (using a fewer/greater number of islands, using islands of different sizes, using islands having fewer/greater individual electrical contacts) may be combined to provide considerable design flexibility, whereby the grading of the layout of the body contact regions may be determined as required for a given size and shape of device area and according to a given ESD protection application.

A device according to an embodiment of this disclosure may be incorporated in an integrated circuit, to provide ESD protection for functional components of the integrated circuit.

A device according to an embodiment of this disclosure may be incorporated in an ESD protection circuit, e.g. as a primary protection element in a pad-based ESD protection scheme.

A method of making an electrostatic discharge protection device according to an embodiment of this disclosure may include forming an array of coextensive, laterally spaced fingers of the kind described above, within a device area located on a major surface of a semiconductor substrate. The method may also include forming a plurality of body contact regions of the kind described above on the substrate. As previously described, a layout of the body contact regions may be graded such that a greater number of body contact regions and/or larger body contact regions are located towards a periphery of the device area than towards a central part of the device area, for encouraging triggering of the electrostatic discharge protection device within the central part of the device area.

Accordingly, there has been described an electrostatic discharge protection device and a method of making the same. The device includes a device area located on a semiconductor substrate. The device also includes an array of coextensive, laterally spaced fingers located within the device area. Each finger includes an elongate source and an elongate drain separated by an elongate gate. The fingers are electrically connected in parallel for conducting an electrostatic discharge current during an electrostatic discharge event. The device further includes a plurality of body contact regions. A layout of the body contact regions is graded such that a greater number of the body contact regions and/or larger body contact regions are located towards a periphery of the device area than towards a central part of the device area. The layout of the body contact regions may encourage triggering of the electrostatic discharge protection device within the central part of the device area.

Although particular embodiments of this disclosure have been described, it will be appreciated that many modifications/additions and/or substitutions may be made within the scope of the claims.

As used herein, it is noted that the use of the phrase "and/or" between a pair of elements indicates a shorthand manner of representing a number of possible combinations that includes each element individually and a combination of both elements. Any one combination may be acted upon or selected in the alternative. For example, an act may be performed upon or a selection may be made from "a first element and/or a second element," which indicates the first element individually, the second element individually, or both the first and second elements may be selected or acted upon.

The invention claimed is:

1. An electrostatic discharge protection device comprising:
   a semiconductor substrate;
   a device area located on the substrate;
   an array of coextensive, laterally spaced fingers located within the device area, each finger comprising an elongate source and an elongate drain separated by an elongate gate, wherein the fingers are electrically connected in parallel for conducting an electrostatic discharge current during an electrostatic discharge event; and a plurality of body contact regions, wherein at least some of the body contact regions comprise a doped island located at a surface of the substrate with one or more individual electrical contacts located on the doped island, wherein the body contact regions have a layout that is graded so that a greater number of the body contact regions, larger body contact regions, or both are located towards a periphery of the device area than towards a central part of the device area and no body contact regions are located within the central part of the device area, and wherein the layout of the body contact regions is configured to trigger the electrostatic discharge protection device within the central part of the device area, wherein the body contact regions are arranged in rows that coextend with the fingers in the device area, and wherein some of the rows of the body contact regions are located towards the central part of the device area and extend across the central part of the device area, and wherein the middle of the rows extending across the central part of the device area do not include any of the body contact regions.

2. The electrostatic discharge protection device of claim 1, comprising a greater number of the doped islands located towards the periphery of the device area than are located towards the central part of the device area.

3. The electrostatic discharge protection device of claim 1, wherein the doped islands include the larger doped islands located towards the periphery of the device area than smaller doped islands located towards the central part of the device area.

4. The electrostatic discharge protection device of claim 3, wherein the body contact regions of the device comprising the larger doped islands include more individual electrical contacts than the body contact regions of the device comprising the smaller doped islands.

5. The electrostatic discharge protection device of claim 1, wherein at least some of the rows of the body contact regions are each located adjacent an elongate source of a finger of the device.

6. The electrostatic discharge protection device of claim 1, wherein each row of the body contact regions has a middle and two ends, and wherein at least some of the rows of the body contact regions include a fewer number of the body contact regions, smaller body contact regions, or both located toward their middle than at their two ends.

7. The electrostatic discharge protection device of claim 1, wherein rows of the body contact regions located towards the central part of the device area include a fewer number of rows of the body contact regions, rows of smaller body contact regions, or both, than rows of the body contact regions located towards the periphery of the device area.

8. The electrostatic discharge protection device of claim 1, wherein the device area is rectangular.

9. The electrostatic discharge protection device of claim 1, wherein the device comprises a grounded gate NMOS transistor or an extended drain NMOS transistor.

10. An electrostatic discharge protection circuit comprising the electrostatic discharge protection device of claim 1.

11. An integrated circuit comprising the electrostatic discharge protection device of claim 1.

* * * * *